US010224386B2

(12) United States Patent
Rieutort-Louis et al.

(10) Patent No.: US 10,224,386 B2
(45) Date of Patent: Mar. 5, 2019

(54) DISPLAY WITH POWER SUPPLY MESH

(71) Applicant: Apple Inc., Cupertino, CA (US)

(72) Inventors: Warren S. Rieutort-Louis, Cupertino, CA (US); Ting-Kuo Chang, San Jose, CA (US); Chieh-Wei Chen, Cupertino, CA (US); Cheng-Ho Yu, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 61 days.

(21) Appl. No.: 15/370,297

(22) Filed: Dec. 6, 2016

(65) Prior Publication Data

US 2018/0090553 A1 Mar. 29, 2018

Related U.S. Application Data

(60) Provisional application No. 62/398,749, filed on Sep. 23, 2016.

(51) Int. Cl.

| | |
|---|---|
| *H01L 29/04* | (2006.01) |
| *H01L 29/10* | (2006.01) |
| *H01L 31/00* | (2006.01) |
| *H01L 27/32* | (2006.01) |
| *H01L 51/52* | (2006.01) |
| *G09G 3/3225* | (2016.01) |

(52) U.S. Cl.
CPC ....... *H01L 27/3276* (2013.01); *G09G 3/3225* (2013.01); *H01L 27/3218* (2013.01); *H01L 27/3262* (2013.01); *H01L 51/5209* (2013.01); *G09G 2300/0426* (2013.01); *G09G 2320/0223* (2013.01); *G09G 2320/0242* (2013.01); *G09G 2330/00* (2013.01)

(58) Field of Classification Search
CPC ............. H01L 27/3276; H01L 27/3279; H01L 51/5209; H01L 27/3297
USPC ...................................... 257/40, 59
See application file for complete search history.

(56) References Cited

U.S. PATENT DOCUMENTS

| | | |
|---|---|---|
| 5,456,013 A | 10/1995 | Elias |
| 6,456,013 B1 | 9/2002 | Komiya et al. |
| (Continued) | | |

FOREIGN PATENT DOCUMENTS

| | | |
|---|---|---|
| CN | 102456712 | 5/2012 |
| CN | 102486910 | 6/2012 |
| CN | 205081121 | 3/2016 |

*Primary Examiner* — Lex Malsawma
*Assistant Examiner* — Eric W Jones
(74) *Attorney, Agent, or Firm* — Treyz Law Group, P.C.; G. Victor Treyz; Joseph F. Guihan

(57) ABSTRACT

An organic light-emitting diode display may have an array of pixels. The pixels may each have an organic light-emitting diode with a respective anode and may be formed from thin-film transistor circuitry formed on a substrate. A mesh-shaped path may be used to distribute a power supply voltage to the thin-film circuitry. The mesh-shaped path may have intersecting horizontally extending lines and vertically extending lines. The horizontally extending lines may be zigzag metal lines that do not overlap the anodes. The vertically extending lines may be straight vertical metal lines that overlap the anodes. The pixels may include pixels of different colors. Angularly dependent shifts in display color may be minimized by ensuring that the anodes of the differently colored pixels overlap the vertically extending lines by similar amounts.

12 Claims, 6 Drawing Sheets

(56) References Cited

U.S. PATENT DOCUMENTS

| | | | |
|---|---|---|---|
| 7,554,261 B2 | 6/2009 | Winters et al. | |
| 8,035,300 B2 | 10/2011 | Kwak | |
| 8,902,133 B2 | 12/2014 | Nakamura | |
| 9,412,327 B2 | 8/2016 | Kim | |
| 9,478,586 B2 | 10/2016 | Lee | |
| 2009/0128018 A1* | 5/2009 | Lee | H01L 27/1229 313/504 |
| 2014/0239270 A1* | 8/2014 | Ko | H01L 27/1255 257/40 |
| 2015/0123104 A1* | 5/2015 | Kao | H01L 51/5246 257/40 |
| 2015/0270317 A1 | 9/2015 | Lee et al. | |
| 2015/0379921 A1 | 12/2015 | Lee et al. | |
| 2016/0035805 A1* | 2/2016 | Kim | H01L 27/3262 345/76 |
| 2016/0079330 A1* | 3/2016 | Oh | H01L 27/3276 257/40 |
| 2016/0118452 A1* | 4/2016 | Pyon | H01L 27/3265 257/40 |
| 2016/0141558 A1* | 5/2016 | Cha | H01L 51/56 257/40 |
| 2018/0151649 A1* | 5/2018 | Han | H01L 27/3248 |

* cited by examiner

DISPLAY WITH POWER SUPPLY MESH

This application claims the benefit of provisional patent application No. 62/398,749, filed Sep. 23, 2016, which is hereby incorporated by reference herein in its entirety.

BACKGROUND

This relates generally to electronic devices and, more particularly, to electronic devices with organic light-emitting diode displays.

Electronic devices often include displays. For example, an electronic device may have an organic light-emitting diode display based on organic-light-emitting diode pixels. Each pixel may have a pixel circuit that includes a respective light-emitting diode. Thin-film transistor circuitry in the pixel circuit may be used to control the application of current to the light-emitting diode in that pixel. The thin-film transistor circuitry may include a drive transistor. The drive transistor and the light-emitting diode in a pixel circuit may be coupled in series between a positive power supply and a ground power supply.

Signals in organic-light-emitting diode displays such as power supply signals may be subject to undesired voltage drops due to resistive losses in the conductive paths that are used to distribute these signals. If care is not taken, these voltage drops can interfere with satisfactory operation of an organic light-emitting diode display. Challenges may also arise in configuring paths to distribute signals within a display while ensuring satisfactory display performance.

SUMMARY

An organic light-emitting diode display may have an array of pixels. The pixels may be formed from organic light-emitting diodes. Each light-emitting diode may have an anode and a cathode.

A mesh-shaped path may be used to distribute a power supply voltage to the thin-film circuitry. The mesh-shaped path may have intersecting horizontally extending lines and vertically extending lines. The horizontally extending lines may be zigzag metal lines that do not overlap the anodes of the light-emitting diodes. The vertically extending lines may be straight vertical metal lines that overlap the anodes.

The pixels may include pixels of different colors. Shifts in display color as a function of viewing angle may be minimized by ensuring that the anodes of the differently colored pixels overlap the vertically extending lines by similar amounts.

DETAILED DESCRIPTION

Figure 1:
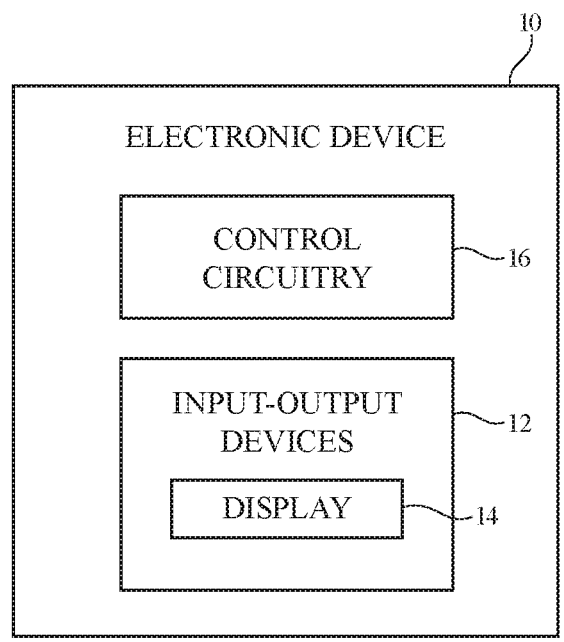
FIG. 1 is a diagram of an illustrative electronic device having a display in accordance with an embodiment.

An illustrative electronic device of the type that may be provided with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 16 may be used to run software on device 10 such as operating system code and applications. During operation of device 10, the software running on control circuitry 16 may display images on display 14.

Figure 2:
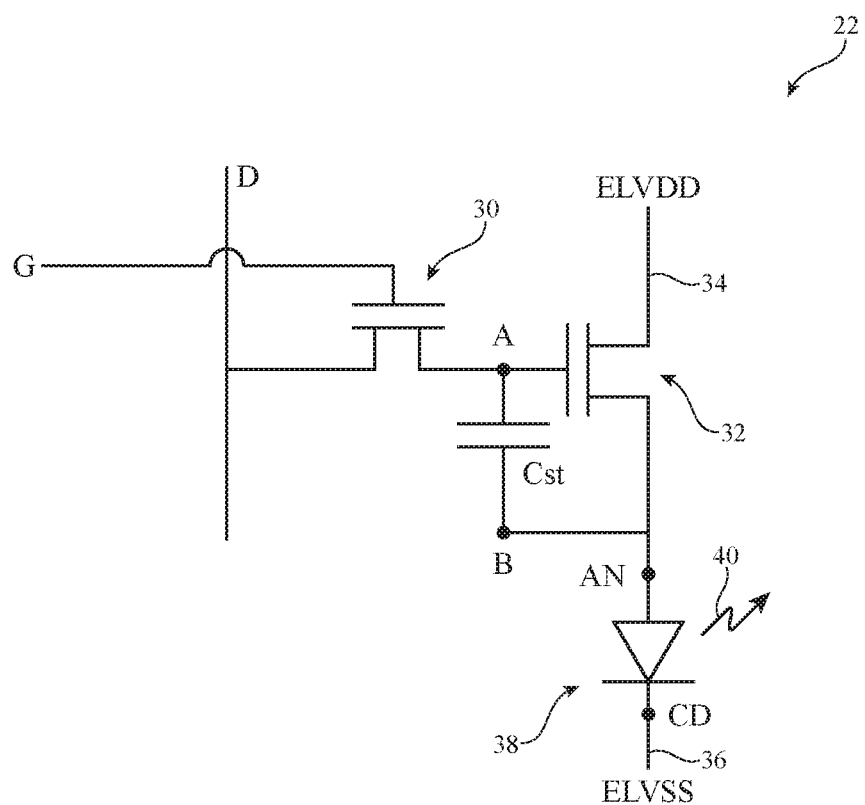
FIG. 2 is a diagram of an illustrative organic light-emitting diode pixel circuit in accordance with an embodiment.

Display 14 may be an organic light-emitting diode display. In an organic light-emitting diode display, each pixel contains a respective organic light-emitting diode. A schematic diagram of an illustrative organic light-emitting diode pixel is shown in FIG. 2. As shown in FIG. 2, pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor Cst. A first terminal of storage capacitor Cst may be coupled to the gate of transistor 32 at node A and a second terminal of storage capacitor Cst may be coupled to anode AN of diode 38 at node B. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on node A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38.

If desired, the circuitry for controlling the operation of light-emitting diodes for pixels 22 in display 14 (e.g., transistors, capacitors, etc. in display pixel circuits such as the display pixel circuit of FIG. 2) may be formed using configurations other than the configuration of FIG. 2 (e.g., configurations that include circuitry for compensating for threshold voltage variations in drive transistor 32, configurations in which an emission enable transistor is coupled in series with drive transistor 32, configurations with multiple switching transistors controlled by multiple respective scan lines, configurations with multiple capacitors, etc.). The thin-film transistors in pixels 22 may be silicon thin-film transistors (e.g., transistors having polysilicon active areas), may be semiconducting-oxide thin-film transistors (e.g., indium gallium zinc oxide transistors), may be n-channel metal oxide-semiconductor transistors, may be p-channel metal-oxide-semiconductor transistors, and/or may include other thin-film circuitry. The circuitry of pixel 22 of FIG. 2 is merely illustrative.

Figure 3:
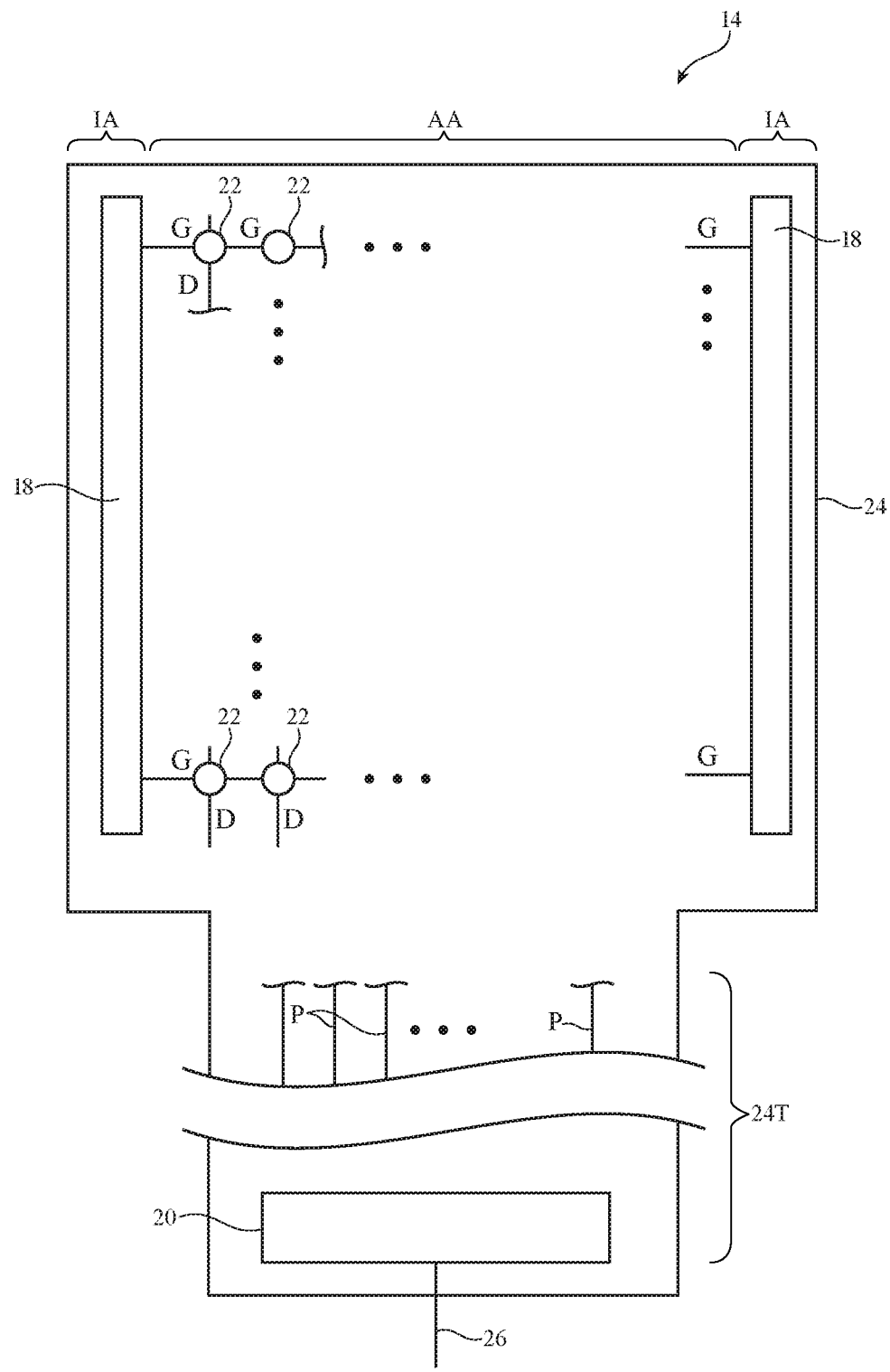
FIG. 3 is a diagram of an illustrative organic light-emitting diode display in accordance with an embodiment.

As shown in FIG. 3, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions. Substrate 24 may have a rectangular shape with left and right vertical edges and upper and lower horizontal edges or may have a non-rectangular shape. In configurations in which substrate 24 has a rectangular shape with four corners, the corners may, if desired, be rounded. Display substrate 24 may, if desired, have a tail portion such as tail 24T.

Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22).

Each pixel 22 may have a light-emitting diode such as organic light-emitting diode 38 of FIG. 2 and associated thin-film transistor circuitry (e.g., the pixel circuit of FIG. 2 or other suitable pixel circuitry). The array of pixels 22 may be formed from rows and columns of pixel structures (e.g., pixels formed from thin-film circuitry on display layers such as substrate 24). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 3, display substrate 24 may have a tail portion such as tail 24T that has a narrower width than the portion of substrate 24 that contains active area AA. This arrangement helps accommodate tail 24T within the housing of device 10. Tail 24T may, if desired, be bent under the rest of display 14 when display 14 is mounted within an electronic device housing.

Display driver circuitry 20 for display 14 may be mounted on a printed circuit board that is coupled to tail portion 24T or may be mounted on tail portion 24T. Signal paths such as signal path 26 may couple display driver circuitry 20 to control circuitry 16. Circuitry 20 may include one or more display driver integrated circuits and/or thin-film transistor circuitry. During operation, the control circuitry of device 10 (e.g., control circuitry 16 of FIG. 1) may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry 18. Gate driver circuitry 18 may produce gate line signals (sometimes referred to as scan signals, emission enable signals, etc.) or other control signals for pixels 22. The gate line signals may be conveyed to pixels 22 using lines such as gate lines G. There may be one or more gate lines per row of pixels 22. Gate driver circuitry 18 may include integrated circuits and/or thin-film transistor circuitry and may be located along the edges of display 14 (e.g., along the left and/or right edges of display 14 as shown in FIG. 3) or elsewhere in display 14 (e.g., as part of circuitry 20 on tail 24T, along the lower edge of display 14, etc.). The configuration of FIG. 3 is merely illustrative.

Display driver circuitry 20 may supply data signals onto a plurality of corresponding data lines D. With the illustrative arrangement of FIG. 3, data lines D run vertically through display 14. Data lines D are associated with respective columns of pixels 22.

With the illustrative configuration of FIG. 3, gate lines G (sometimes referred to as scan lines, emission lines, etc.) run horizontally through display 14. Each gate line G is associated with a respective row of display pixels 22. If desired, there may be multiple horizontal control lines such as gate lines G associated with each row of pixels 22. Gate driver circuitry 18 may assert gate line signals on the gate lines G in display 14. For example, gate driver circuitry 18 may receive clock signals and other control signals from display driver circuitry 20 and may, in response to the received signals, assert a gate signal on gate lines G in sequence, starting with the gate line signal G in the first row of display pixels 22. As each gate line is asserted, data from data lines D is loaded into the corresponding row of display pixels. In this way, control circuitry in device 10 such as display driver circuitry 20 may provide pixels 22 with signals that direct pixels 22 to generate light for displaying a desired image on display 14.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin-film transistors, semiconducting-oxide transistors such as indium gallium zinc oxide transistors, etc.).

Conductive paths (e.g., one or more signal lines, blanket conductive films, mesh-shaped conductive layers, and other patterned conductive structures) may be provided in display 14 to route data signals D and power signals such as positive power supply signal ELVDD and ground power supply signal ELVSS to pixels 22. As shown in FIG. 3, these signals may be provided to pixels 22 in active area AA using signal routing paths P. Paths P may be formed from metal lines and/or other conductive structures that receive signals D, ELVDD, and ELVSS from tail portion 24T of display 14.

Figure 4:
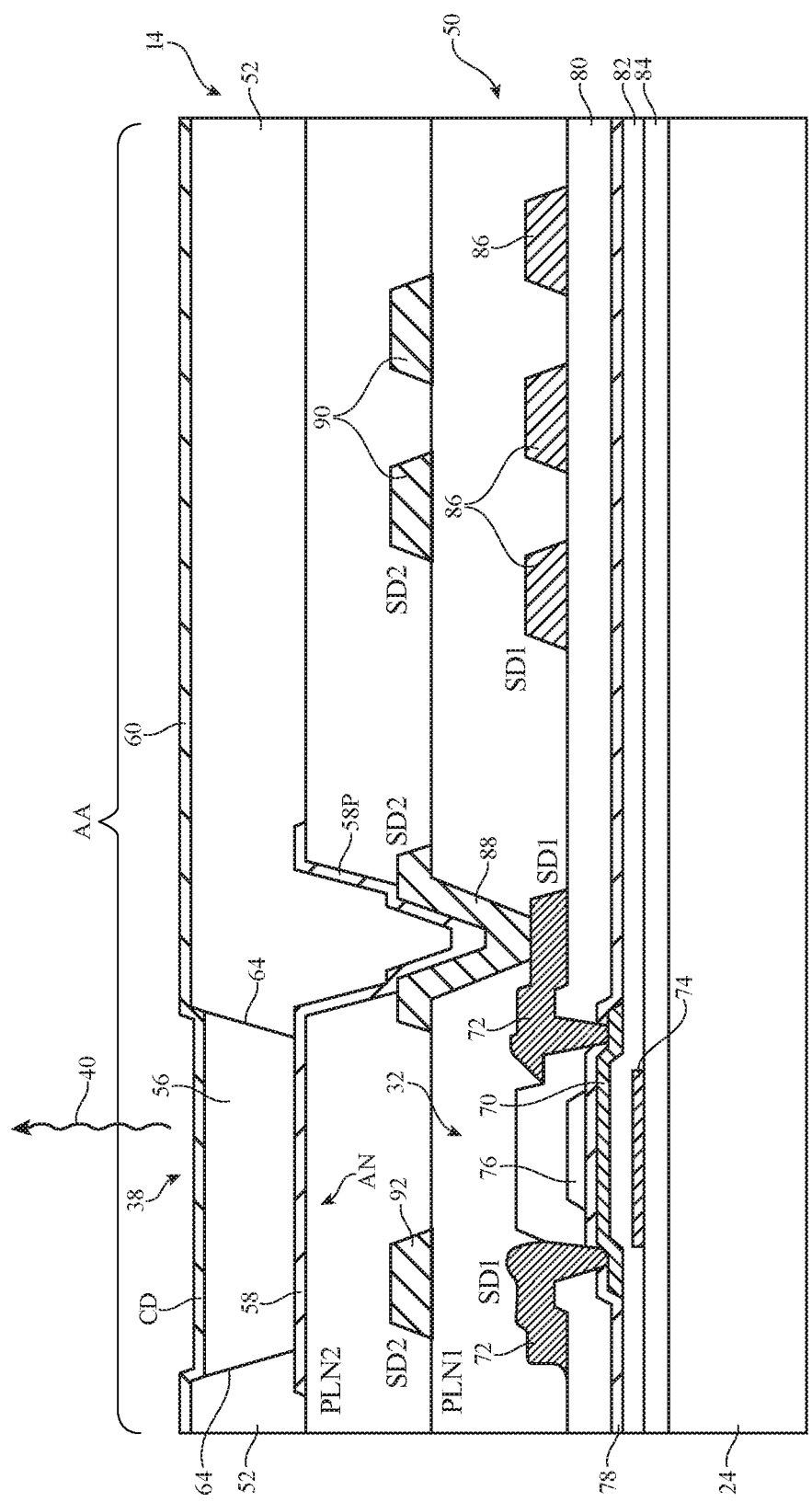
FIG. 4 is a cross-sectional side view of a portion of an active area of an illustrative organic light-emitting diode display in accordance with an embodiment.

A cross-sectional side view of a portion of active area AA of display 14 showing an illustrative configuration that may be used for forming pixels 22 is shown in FIG. 4. As shown in FIG. 4, display 14 may have a substrate such as substrate 24. Thin-film transistors, capacitors, and other thin-film transistor circuitry 50 (e.g., thin-film circuitry such as the illustrative pixel circuitry of FIG. 2) may be formed on substrate 24. Pixel 22 may include organic light-emitting diode 38. Anode AN of diode 38 may be formed from metal layer 58 (sometimes referred to as an anode metal layer). Each diode 38 may have a cathode CD formed from conductive cathode structures such as cathode layer 60. Layer 60 may be, for example, a thin layer of metal such as a layer of magnesium silver with a thickness of 10-18 nm, more than 8 nm, less than 25 nm, etc. Layer 60 may cover all of pixels 22 in active area AA of display 14 and may have portions that extend into inactive area IA display 14 (e.g., so that layer 60 is coupled to ground power supply paths that supply layer 60 with ground power supply voltage ELVSS).

Each diode 38 has an organic light-emitting emissive layer (sometimes referred to as emissive material or an emissive layer structure) such as emissive layer 56. Emissive layer 56 is an electroluminescent organic layer that emits light 40 in response to applied current through diode 38. In a color display, emissive layers 56 in the array of pixels in the display include red emissive layers for emitting red light in red pixels, green emissive layers for emitting green light in green pixels, and blue emissive layers for emitting blue light in blue pixels. In addition to the emissive organic layer in each diode 38, each diode 38 may include additional layers for enhancing diode performance such as an electron injection layer, an electron transport layer, a hole transport layer, and a hole injection layer. Layers such as these may be formed from organic materials (e.g., materials on the upper and lower surfaces of electroluminescent material in layer 56).

Layer 52 (sometimes referred to as a pixel definition layer) has an array of openings containing respective portions of the emissive material of layer 56. An anode AN is formed at the bottom of each of these openings and is overlapped by emissive layer 56. The shape of the diode opening in pixel definition layer 52 therefore defines the shape of the light-emitting area for diode 38.

Pixel definition layer 52 may be formed from a photoimageable material that is photolithographically patterned (e.g., dielectric material that can be processed to form photolithographically defined openings such as photoimageable polyimide, photoimageable polyacrylate, etc.), may be formed from material that is deposited through a shadow mask, or may be formed from material that is otherwise patterned onto substrate 24. The walls of the diode openings in pixel definition layer 52 may, if desired, be sloped, as shown by sloped sidewalls 64 in FIG. 4.

Thin-film circuitry 50 may contain transistors such as illustrative transistor 32. Thin-film transistor circuitry such as illustrative thin-film transistor 32 of FIG. 4 may have active areas (channel regions) formed from a patterned layer of semiconductor such as layer 70. Layer 70 may be formed from a semiconductor layer such as a layer of polysilicon or a layer of a semiconducting-oxide material (e.g. indium gallium zinc oxide). Source-drain terminals 72 may contact opposing ends of semiconductor layer 70. Gate 76 may be formed from a patterned layer of gate metal or other conductive layer and may overlap semiconductor 70. Gate insulator 78 may be interposed between gate 76 and semiconductor layer 70. A buffer layer such as dielectric layer 84 may be formed on substrate 24 under shield 74. A dielectric layer such as dielectric layer 82 may cover shield 74. Dielectric layer 80 may be formed between gate 76 and source-drain terminals 72. Layers such as layers 84, 82, 78, and 80 may be formed from dielectrics such as silicon oxide, silicon nitride, other inorganic dielectric materials, or other dielectrics. Additional layers of dielectric such as polymer planarization layers PLN1 and PLN2 or other organic planarization layers may be included in thin-film transistor structures such as the structures of transistor 32 and may help planarize display 14.

Display 14 may have multiple layers of conductive material embedded in the dielectric layers of display 14 such as metal layers for routing signals through pixels 22. Shield layer 74 may be formed from a first metal layer (as an example). Gate layer 76 may be formed from a second metal layer. Source-drain terminals such as terminals 72 and other structures such as signal lines 86 may be formed from portions of a third metal layer such as metal layer SD1. Metal layer SD1 may be formed on dielectric layer 80 and may be covered with planarization dielectric layer PLN1. A fourth layer of metal such as metal layer SD2 may be used in forming diode via portion 88, signal lines 90, and power supply paths such as path 92 (e.g., a mesh-shaped ELVDD layer). In active area AA, a fifth layer of metal such as anode metal layer 58 may form anodes AN of diodes 38. The fifth metal layer in each pixel may have a portion such as via portion 58P that is coupled to via portion 88, thereby coupling one of the source-drain terminals of transistor 32 to anode AN of diode 38. A sixth layer of metal (e.g., a blanket film) such as cathode metal layer 60 may be used in forming cathode CD for light-emitting diode 38. Anode layer 58 may be interposed between metal layer SD2 and cathode layer 60. Layers such as layer 58, SD2, SD1, 76, and 74 may be embedded within the dielectric layers of display 14 that are supported on substrate 24. If desired, fewer metal layers may be provided in display 14 or display 14 may have more metal layers. The configuration of FIG. 4 is merely illustrative.

It is desirable to minimize ohmic losses (sometimes referred to as IR losses) when distributing power signals to pixels 22 to ensure that display 14 operates efficiently and produces images with even brightness across display 14.

Ohmic losses may be minimized by incorporating low-resistance signal pathways into through display 14.

Consider, for example, the power supply path used to distribute positive power supply ELVDD. If the resistance associated with this path is too high, IR losses may cause the positive power supply voltage of pixels 22 near the lower edge of display 14 where ELVDD is supplied to be greater in magnitude than the positive power supply voltage of pixels 22 in the middle of display 14. This can cause undesired variations in pixel brightness.

To minimize undesired IR losses, the conductive path that is used in distributing power supply voltage ELVDD (sometimes referred to as the positive power supply path, positive power supply distribution path, etc.) may be formed using a mesh-shaped pattern of conductive material (e.g., metal). For example, power supply path 92 of FIG. 4 may be formed from a grid of interconnected metal lines with an array of openings that accommodate vias and other thin-film structures (see, e.g., via portion 58P, signal lines 90, etc.). This type of mesh-shaped power supply distribution path may exhibit a low sheet resistance and minimal IR losses, thereby enhancing display brightness uniformity.

Figure 5:
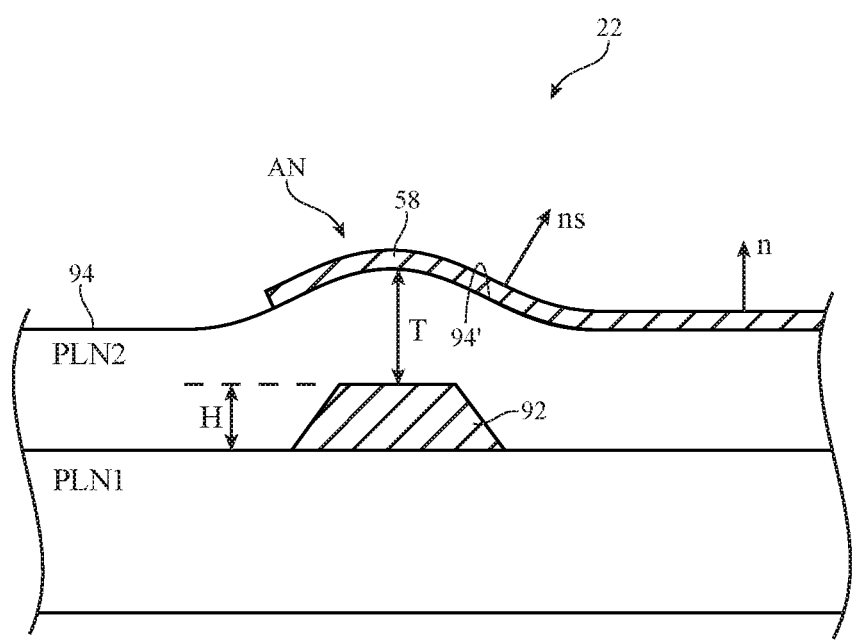
FIG. 5 is cross-sectional side view of a portion a pixel in accordance with an embodiment.

As shown in FIG. 5, at least some of the metal layer 58 that forms anode AN may overlap power supply distribution path 92. Planarization layer PLN2 may cover path 92 and anode AN may be formed on upper surface 94 of layer PLN2. The thickness H of the metal layer (SD2) that forms path 92 may be, for example, 0.7 microns, 0.5 to 0.9 microns, 0.2 to 1.2 microns, more than 0.2 microns, less than 0.9 microns, or other suitable thickness. The thickness T of planarization layer PLN2 may be, for example, 0.9 microns, 0.7 to 1.1 microns, more than 0.5 microns, less than 1.5 microns, or any other suitable thickness.

It may be desirable to limit the total thickness of planarization layer PLN2 (e.g., to minimize outgassing from the polymer of layer PLN2). When the thickness of layer PLN2 is limited, upper surface 94 of planarization layer PLN2 may be sloped under part of anode AN due to the presence of path 92. Sloped portion 94' of surface 94 may have a surface normal ns that is oriented at a non-zero angle with respect to surface normal n of the unsloped (planar) portion of surface 94 (i.e., surface normal ns of sloped portion 94' may be oriented at a non-zero angle with respect to the surface normal of display 14).

Due to the presence of sloped portions 94' in pixels 22 (and, in particular, different amounts of sloped portions 94' in pixels of different colors), there is a risk that display 14 will exhibit changes in color as a function of viewing angle. In configurations for display 14 in which each pixel 22 has an anode AN with a similar amount of sloped area, display 14 will exhibit reduced color shifts as a function of changes in viewing angle. For example, the white point of display 14 will exhibit reduced color shifts as a function of changes in the angle with which display 14 is viewed.

In view of these considerations, it may be desirable to limit the amount of sloped area (portion 94') relative to the total surface area of anode AN in each pixel 22 and/or to limit the amount of variation in the sloped area of each pixel between pixels of different colors. As an example, it may be desirable for the overlap area (the area consumed by sloped portion 94') in the red, green, and blue pixels of display 14 to vary by less than 30%, less than 20%, less than 15%, less than 10%, less than 5%, or less than 2% from each other.

Figure 6:
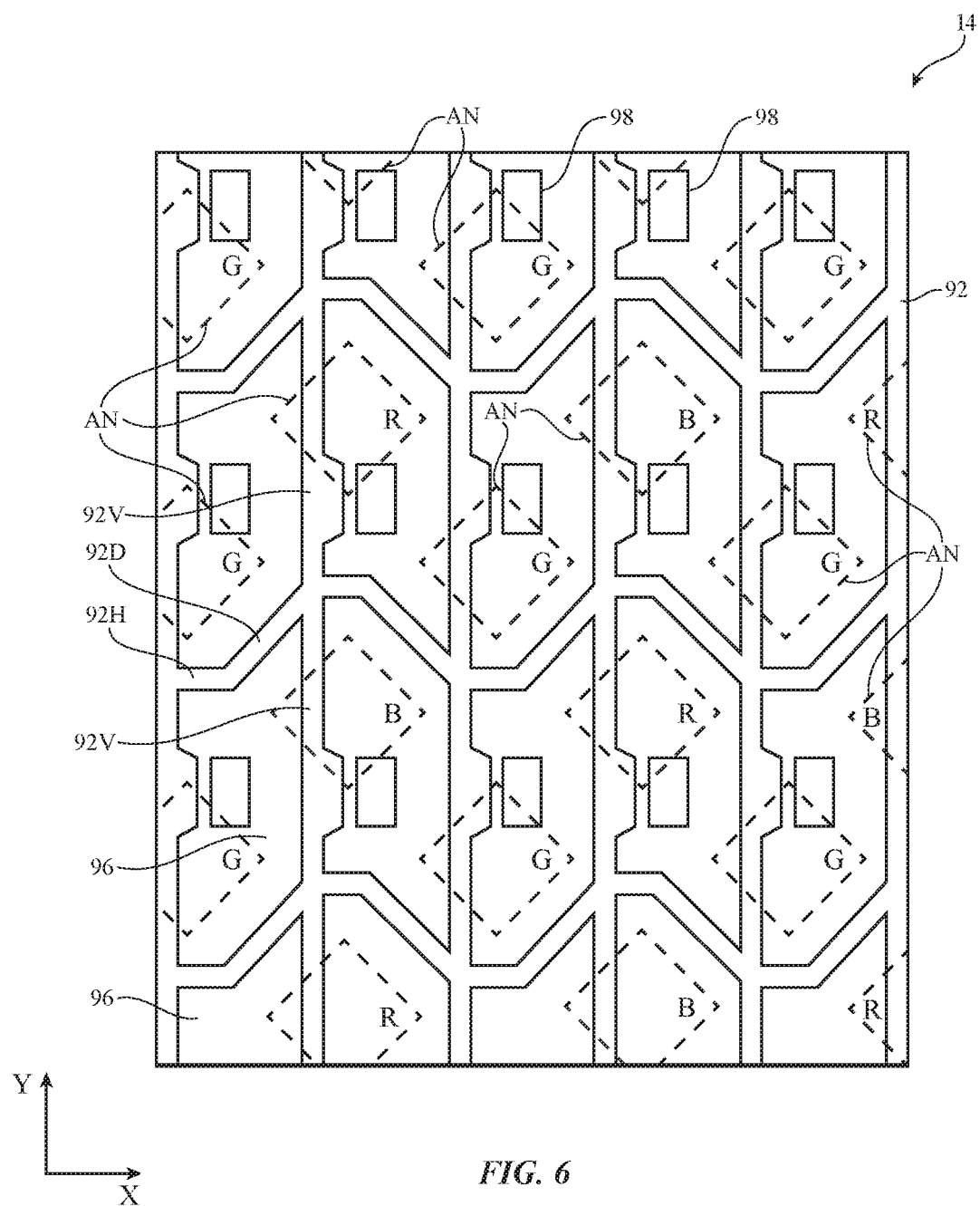
FIG. 6 is a diagram showing an illustrative mesh pattern that may be used for a power supply distribution path in a display in accordance with an embodiment.

An illustrative configuration for display 14 in which display 14 has a mesh-shaped power supply distribution path 92 is shown in FIG. 6. As shown in FIG. 6, display 14 may include red pixels R, green pixels G, and blue pixels B with respective anodes AN. Anodes AN have diamond shapes in the example of FIG. 6. If desired, anodes AN may have circular shapes, hexagonal shapes, rectangular shapes in which the edges of the anodes run horizontally and vertically, triangular shapes, or other suitable shapes. As shown in the example of FIG. 6, diamond-shaped anodes AN may have edges that extend diagonally with respect to vertical dimension Y (and corresponding diamond-shaped openings in pixel definition layer 52 and corresponding diamond-shaped regions of emissive layer 56). Anodes of other shapes may be used, if desired.

The anodes AN of green pixels G may extend horizontally across display 14 in rows. A row of alternating red pixels R and blue pixels B may be interposed between each pair of green pixel rows. For example, if the first and third rows of display 14 contain only green pixels, the second row of display 14 may contain red and blue pixels. Other patterns of pixel colors may be used, if desired. For example, even (or odd) rows of the array of pixels 22 of display 14 may contain alternating green and blue pixels and odd (or even) rows of the array of pixels 22 of display 14 may contain alternating red and green pixels (as an example). The use of the pixel color pattern of FIG. 6 is merely illustrative.

Power supply distribution path 92 may have a mesh shape (grid shape) formed from a network of intersecting horizontally extending and vertically extending metal lines. As shown in FIG. 6, mesh-shaped path 92 may have a grid of interconnected metal lines formed from a patterned metal layer (e.g., metal layer SD2) with an array of openings 96. Openings 96 may be arranged in rows and columns and may be aligned with red pixels R, green pixels G, and blue pixels B. Contacts 98 may be formed from via portions 58P and 88 in openings 96 (see, e.g., FIG. 4).

The mesh shape of power supply distribution path 92 may help reduce IR losses when distributing power to pixels 22 (e.g., when distributing positive power supply voltage ELVDD). As shown in FIG. 6, the grid of path 92 may be formed from horizontal lines that extend horizontally across display 14 along dimension X. Each horizontal line in mesh-shaped path 92 may have segments 92H that extend horizontally (parallel to horizontal dimension X) and interspersed diagonal segments 92D that run diagonally. The diagonal segments 92D are each located between opposing diagonal edges of a pair of the anodes. The horizontally extending portions (lines) of path 92 therefore exhibit a zigzag metal line shape that allows these portions of path 92 to avoid crossing any anodes AN. Because the use of zigzag horizontal lines in path 92 helps prevent the horizontally extending portions (horizontal grid lines) of path 92 from overlapping anodes AN, the arrangement of FIG. 6 helps prevent formation of sloped portions of anodes AN where the anodes AN overlap horizontal portions of path 92. As a result, anodes AN may only overlap vertical portions of path 92 and may exhibit similar overlap areas.

Power supply currents may flow vertically through display 14 (e.g., from tail 24T upwards to the columns of pixels 22). As a result, it may be desirable to use grid lines without zigzags when forming the vertically extending portions of path 92. As shown in the example of FIG. 6, each vertically extending portion of path 92 (each vertical grid line of path 92) may be formed from a straight vertical line 92V that runs parallel to dimension Y. The use of vertical lines 92V in path 92 may help to minimize IR losses by minimizing vertical line lengths and may allow the layout of path 92 to satisfy design rules (e.g., by supplying sufficient spacing between path 92 and adjacent structures).

The use of vertical lines 92V may give rise to an overlap between vertical lines 92V of path 92 and anodes AN, as shown in FIG. 6. Anodes AN may have diamond shapes with edges that extend diagonally (at a non-zero angle) with respect to vertical lines 92V. As described in connection with FIG. 5, angularly dependent color shifts may be minimized by ensuring that the size of each overlap region (i.e., the amount of anode area in each pixel that overlaps path 92) is substantially the same for the red pixels R, the blue pixels B, and the green pixels G. If, for example, the overlap between the anode AN of each pixel R and path 92 is characterized by area OR, the overlap between the anode AN of each green pixel G and path 92 is characterized by area OG, and the overlap between the anode AN of each blue pixel B and path 92 is characterized by area OB, changes in display color cast as a function of viewing angle for display 14 may be minimized by ensuring that OR, OG, and OB are all within 30% of each other, within 20% of each other, within 15% of each other, within 10%, of each other, within 5% of each other, within 2% of each other, within 1-40% of each other, etc.

The foregoing is merely illustrative and various modifications can be made to the described embodiments. The foregoing embodiments may be implemented individually or in any combination.

What is claimed is:

1. An organic light-emitting diode display, comprising:
   a substrate;
   an array of pixels on the substrate, each pixel being configured to receive a power supply voltage and each pixel having a light-emitting diode with an anode;
   a planarization layer on which the anodes are formed; and
   a mesh-shaped power supply distribution path formed from horizontally extending zigzag metal lines and vertically extending lines, wherein the anodes overlap the vertically extending lines and do not overlap the horizontally extending zigzag metal lines.

2. The organic light-emitting diode display defined in claim 1 wherein each pixel has a positive power supply terminal and a ground power supply terminal and wherein the mesh-shaped power supply distribution path is a positive power supply distribution path coupled to the positive power supply terminals of the pixels.

3. The organic light-emitting diode display defined in claim 2 wherein each anode has a diamond shape with edges that extend diagonally with respect to the vertically extending lines.

4. The organic light-emitting diode display defined in claim 3 wherein each of the vertically extending lines is a respective vertically extending straight metal line.

5. The organic light-emitting diode display defined in claim 4 wherein the pixels include pixels of different colors each of which is characterized by a respective overlap area with the vertically extending straight metal lines and wherein the overlap areas of the pixels of different colors differ by less than 20%.

6. The organic light-emitting diode display defined in claim 5 wherein the overlap areas of the pixels of different colors differ by less than 10%.

7. The organic light-emitting diode display defined in claim 1 further comprising thin-film transistors on the substrate, wherein the thin-film transistors have source-drain terminals formed from a first metal layer, wherein a polymer layer overlaps the first metal layer, and wherein the mesh-shaped power supply distribution path is interposed between the polymer layer and the planarization layer.

8. The organic light-emitting diode display defined in claim 1 wherein each horizontally extending zigzag metal line has at least one diagonal segment between opposing diagonal edges of a pair of the anodes.

9. The organic light-emitting diode display defined in claim 1 wherein the vertically extending lines each extend parallel to a first axis, wherein the horizontally extending zigzag metal lines each include a plurality of horizontal segments that extend parallel to a second axis that is perpendicular to the first axis and a plurality of diagonal segments, wherein each diagonal segment is interposed between a respective two horizontal segments, and wherein each diagonal segment extends parallel to a respective axis that is at a non-zero angle with respect to the first and second axes.

10. An organic light-emitting diode display, comprising:
    a substrate;
    thin-film circuitry on the substrate;
    first and second polymer planarization layers on the thin-film circuitry;
    a patterned metal layer between the first and second polymer planarization layers that forms a mesh-shaped positive power supply distribution path that distributes a positive power supply voltage to the thin-film circuitry, wherein the mesh-shaped positive power supply distribution path has a grid of intersecting vertically extending lines that each extend parallel to a first axis and horizontally extending zigzag metal lines, wherein the horizontally extending zigzag metal lines each include a plurality of horizontal segments that extend parallel to a second axis that is perpendicular to the first axis and a plurality of diagonal segments, wherein each diagonal segment is interposed between a respective two horizontal segments, and wherein each diagonal segment extends parallel to a respective axis that is at a non-zero angle with respect to the first and second axes; and
    an array of organic light-emitting diodes, each organic light-emitting diode having a respective anode on the second polymer planarization layer.

11. The organic light-emitting diode display defined in claim 10, wherein the anodes overlap the vertically extending lines and do not overlap the horizontally extending zigzag metal lines.

12. The organic light-emitting diode display defined in claim 10, wherein each anode is characterized by a respective overlap area with the mesh-shaped positive power supply distribution path, wherein the overlap area for each anode is less than 50% of the area of that anode, and wherein the overlap areas of the anodes differ by less than 30%.

* * * * *